(12) United States Patent
Sato et al.

(10) Patent No.: US 12,230,600 B2
(45) Date of Patent: Feb. 18, 2025

(54) SEMICONDUCTOR DEVICE HAVING THROUGH PARTS OF DIFFERENT SHAPES

(71) Applicant: FUJI ELECTRIC CO., LTD., Kanagawa (JP)

(72) Inventors: Narumi Sato, Matsumoto (JP); Yuichiro Hinata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 518 days.

(21) Appl. No.: 17/385,981

(22) Filed: Jul. 27, 2021

(65) Prior Publication Data

US 2022/0077103 A1 Mar. 10, 2022

(30) Foreign Application Priority Data

Sep. 10, 2020 (JP) ................................. 2020-152406

(51) Int. Cl.
| | |
|---|---|
| H01L 23/00 | (2006.01) |
| H01L 25/00 | (2006.01) |
| H01L 25/07 | (2006.01) |
| H01L 25/18 | (2023.01) |
| H05K 1/18 | (2006.01) |

(52) U.S. Cl.
CPC ............. *H01L 24/75* (2013.01); *H01L 24/81* (2013.01); *H01L 25/072* (2013.01); *H01L 25/18* (2013.01); *H01L 25/50* (2013.01); *H05K 1/18* (2013.01); *H01L 2224/75704* (2013.01); *H01L 2224/75755* (2013.01); *H01L 2224/7598* (2013.01); *H01L 2224/81136* (2013.01); *H01L 2224/81815* (2013.01); *H05K 2201/09063* (2013.01); *H05K 2201/09163* (2013.01); *H05K 2201/10303* (2013.01)

(58) Field of Classification Search
None
See application file for complete search history.

(56) References Cited

U.S. PATENT DOCUMENTS

| | | | | |
|---|---|---|---|---|
| 5,973,929 A | * | 10/1999 | Arakawa | H05K 1/115 |
| | | | | 361/302 |
| 9,385,061 B2 | * | 7/2016 | Nakamura | H01L 23/08 |

(Continued)

FOREIGN PATENT DOCUMENTS

| | | | | |
|---|---|---|---|---|
| CN | 107135612 A | * | 9/2017 | .......... H05K 1/0269 |
| CN | 207636875 U | * | 7/2018 | |

(Continued)

OTHER PUBLICATIONS

Office Action issued for counterpart Japanese Application No. 2020-152406, transmitted from the Japanese Patent Office on Jun. 11, 2024 (drafted on Jun. 6, 2024).

*Primary Examiner* — Telly D Green

(57) ABSTRACT

A semiconductor device including: a semiconductor chip; a plurality of insulating substrates mounted with the semiconductor chip; a printed circuit board facing the plurality of insulating substrates; and a conductive member for electrically connecting the plurality of insulating substrates and the printed circuit board is provided. The printed circuit board has a first through part arranged between the plurality of insulating substrates being adjacent to each other in a top view, and a second through part different from the first through part in shape in the top view.

10 Claims, 15 Drawing Sheets

(56) References Cited

U.S. PATENT DOCUMENTS

| | | | |
|---|---|---|---|
| 9,521,758 B2* | 12/2016 | Hatasa | H05K 3/306 |
| 9,691,692 B2* | 6/2017 | Miyakoshi | H01L 24/32 |
| 2011/0076800 A1 | 3/2011 | Hirai | |
| 2012/0181738 A1 | 7/2012 | Hirose | |
| 2014/0355219 A1* | 12/2014 | Tada | H05K 1/117 361/729 |
| 2015/0187689 A1* | 7/2015 | Nashida | H01L 23/49575 257/774 |
| 2015/0223339 A1* | 8/2015 | Nakamura | H05K 7/2089 361/779 |
| 2015/0380335 A1* | 12/2015 | Takematsu | H01L 24/01 257/77 |
| 2017/0077068 A1* | 3/2017 | Horio | H01L 25/18 |
| 2017/0194296 A1* | 7/2017 | Yasui | H01L 24/85 |
| 2019/0131217 A1* | 5/2019 | Asai | H01L 24/92 |
| 2019/0148258 A1* | 5/2019 | Taniguchi | H01L 23/49811 257/668 |
| 2019/0232292 A1* | 8/2019 | Stein | H05K 1/0212 |
| 2019/0287887 A1* | 9/2019 | Nakamura | H01L 25/18 |
| 2020/0091130 A1* | 3/2020 | Taniguchi | H01L 28/20 |
| 2020/0118986 A1* | 4/2020 | Hori | H01L 23/427 |
| 2020/0288596 A1* | 9/2020 | Weber | H05K 1/0215 |
| 2020/0335375 A1* | 10/2020 | Onishi | H01L 24/75 |
| 2020/0365419 A1* | 11/2020 | Onishi | H01L 23/04 |

FOREIGN PATENT DOCUMENTS

| | | | | |
|---|---|---|---|---|
| EP | 3499649 A1 | 6/2019 | | |
| JP | H03170379 A | 7/1991 | | |
| JP | H0497595 A | 3/1992 | | |
| JP | H06291230 A | 10/1994 | | |
| JP | H10284639 A | 10/1998 | | |
| JP | 2007242703 A | 9/2007 | | |
| JP | 2009224550 A | 10/2009 | | |
| JP | 2011077267 A | 4/2011 | | |
| JP | 2012119618 A | 6/2012 | | |
| JP | 2012148287 A | 8/2012 | | |
| JP | 5644440 B2 | 12/2014 | | |
| JP | 6202094 B2 | 9/2017 | | |
| JP | 2019083294 A | 5/2019 | | |
| JP | 2019140236 A | 8/2019 | | |
| JP | 2019161174 A | 9/2019 | | |
| WO | 2014185050 A1 | 11/2014 | | |
| WO | WO-2014196309 A1 * | 12/2014 | | H01L 23/053 |
| WO | WO-2015049944 A1 * | 4/2015 | | H01L 23/051 |

* cited by examiner

SEMICONDUCTOR DEVICE HAVING THROUGH PARTS OF DIFFERENT SHAPES

The contents of the following Japanese patent applications are incorporated herein by reference:

NO. 2020-152406 filed in JP on Sep. 10, 2020.

BACKGROUND

1. Technical Field

The present invention relates to a semiconductor device and a manufacturing method of the semiconductor device.

2. Related Art

Conventionally, a semiconductor device including a printed circuit board that is electrically connected to a semiconductor chip has been known (for example, refer to Patent Documents 1 to 6).

Patent Document 1: Japanese Patent Application Publication No. 4-97595
Patent Document 2: Japanese Patent Application Publication No. 10-284639
Patent Document 3: Japanese Patent Application Publication No. 2012-148287
Patent Document 4: Japanese Patent Application Publication No. 3-170379
Patent Document 5: Japanese Patent No. 6202094
Patent Document 6: Japanese Patent No. 5644440

SUMMARY

DESCRIPTION OF EXEMPLARY EMBODIMENTS

Hereinafter, the present invention will be described through embodiments of the invention. However, the following embodiments do not limit the claimed invention. In addition, some combinations of features described in the embodiments may be unnecessary for solving means of the invention.

In this specification, one side of a semiconductor device may be referred to as "upper", and the other side may be referred to as "lower". One of two main surfaces of a substrate, a layer, or another member may be referred to as an upper surface, and the other surface may be referred to as a lower surface. A direction described as "upper" or "lower" is not limited by a direction of the gravity. That is, the direction described as "upper" or "lower" is not limited by a direction of attaching a semiconductor device on a board or the like upon mounting.

In this specification, technical matters may be described with orthogonal coordinate axes of an X-axis, a Y-axis, and a Z-axis. In one example, a surface parallel to an upper surface of a semiconductor chip is considered as an X-Y plane, and a depth direction of the semiconductor chip being a depth direction of a semiconductor substrate is considered as the Z-axis. For example, a positive side of a surface in the Z-axis direction is considered as an upper surface, and a negative side of a surface in the Z-axis direction is considered as a lower surface.

Figure 1A:
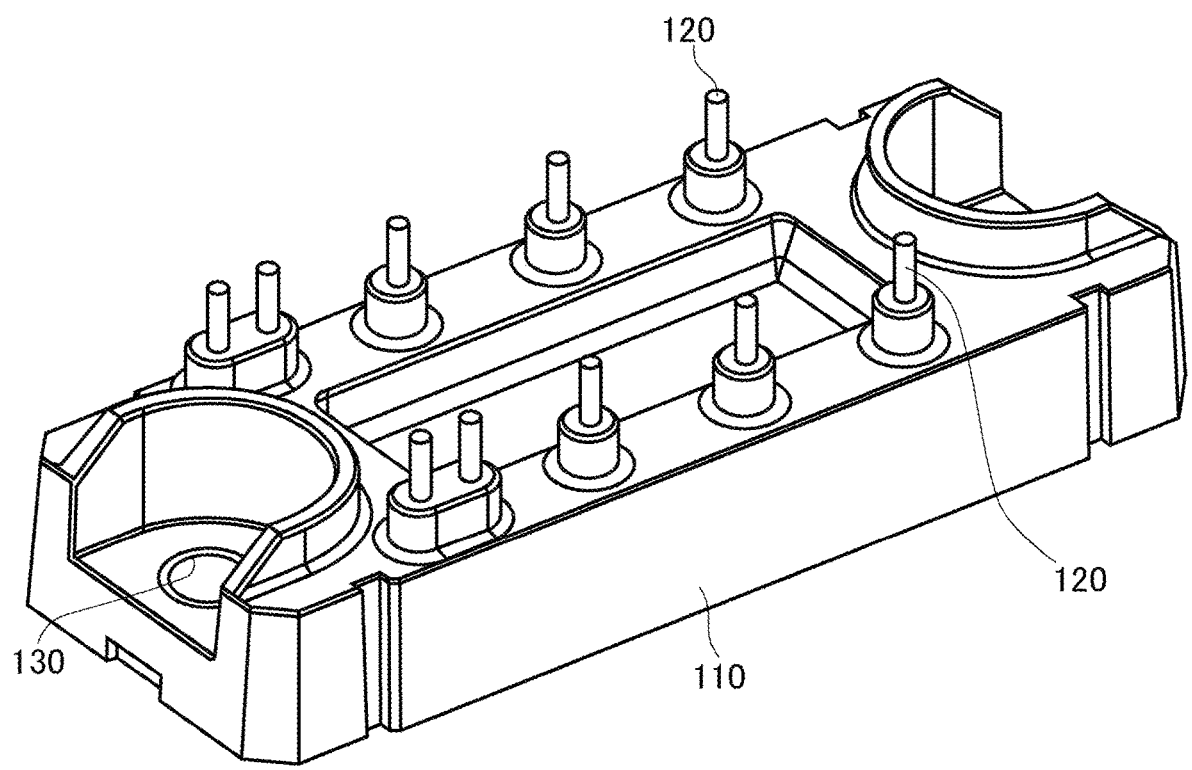
FIG. 1A is a perspective view of an upper surface of a semiconductor device 100.
Figure 1A:
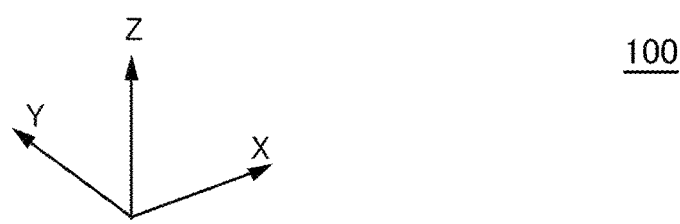

FIG. 1A is a perspective view of an upper surface of a semiconductor device 100. The semiconductor device 100 of the present example is a power semiconductor module. The semiconductor device 100 includes a housing 110 and a conductive pin 120.

The housing 110 contains a semiconductor chip 20 of the semiconductor device 100. The semiconductor chip 20 will be described later. The housing 110 is molded with an insulating resin. The housing 110 of the present example is a molding that is molded into a rectangular parallelepiped shape with a thermosetting resin such as an epoxy resin.

The conductive pin 120 is for connecting an internal circuit of the semiconductor device 100 to outside of the semiconductor device 100. The semiconductor device 100 includes a plurality of conductive pins 120. The conductive pin 120 may include an input/output terminal for inputting or outputting current to the outside of the semiconductor device 100, and a control terminal for inputting a control signal from the outside of the semiconductor device 100 to the semiconductor chip 20.

A mounting hole 130 passes through the semiconductor device 100 from an upper surface to a lower surface. By inserting a fixing tool such as a bolt into the mounting hole 130, the semiconductor device 100 can be fixed at a predetermined position. The semiconductor device 100 of the present example includes a plurality of mounting holes 130 at both ends in the X-axis direction. Note that, this configuration of the semiconductor device 100 of the present example is merely one example, and thus a configuration of the semiconductor device 100 is not limited to this configuration.

Figure 1B:
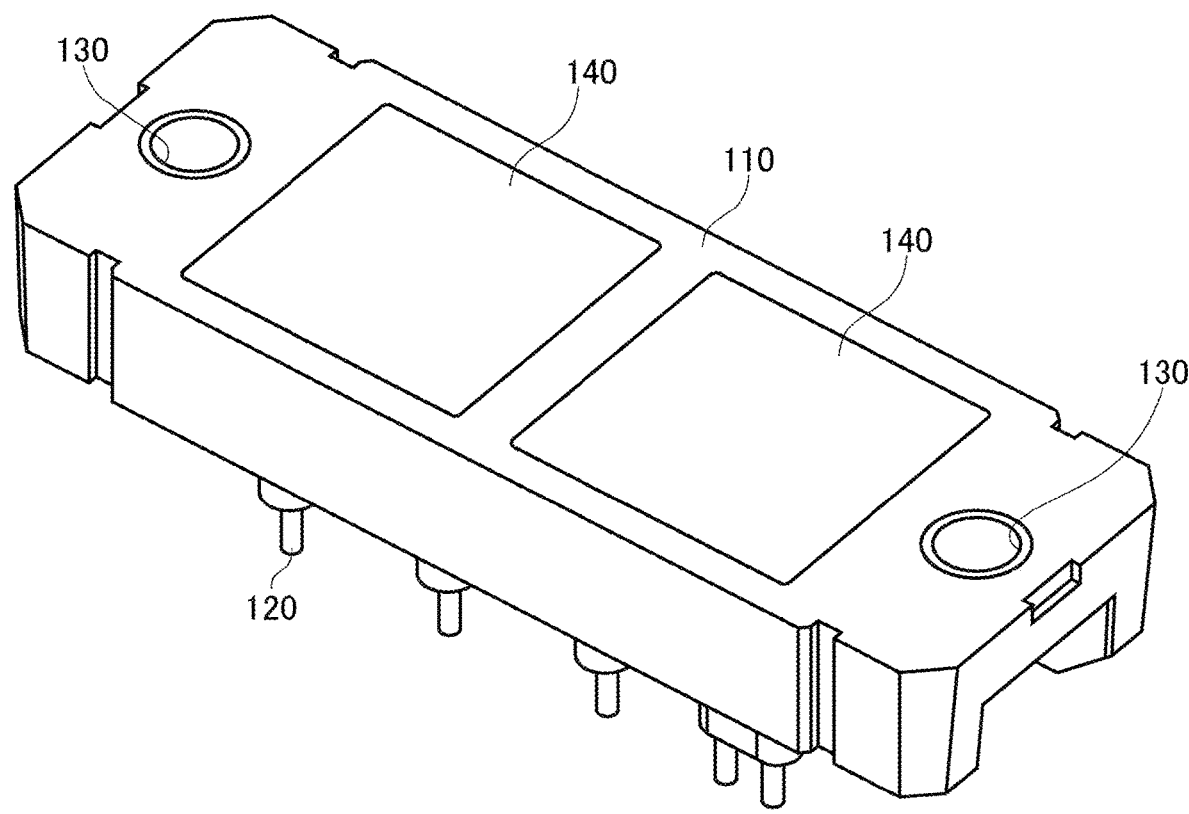
FIG. 1B is a perspective view of a lower surface of the semiconductor device 100.

FIG. 1B is a perspective view of the lower surface of the semiconductor device 100. The semiconductor device 100 includes a plurality of heat radiation parts 140.

The plurality of heat radiation parts 140 is aligned on the lower surface of the semiconductor device 100 along the X-axis direction. The plurality of heat radiation parts 140 corresponds to a plurality of insulating substrates 10 that is inside the semiconductor device 100. The plurality of heat radiation parts 140 radiates heat generated in the semiconductor chip 20 to the outside of the semiconductor device 100. The insulating substrate 10 will be described later.

Figure 1C:
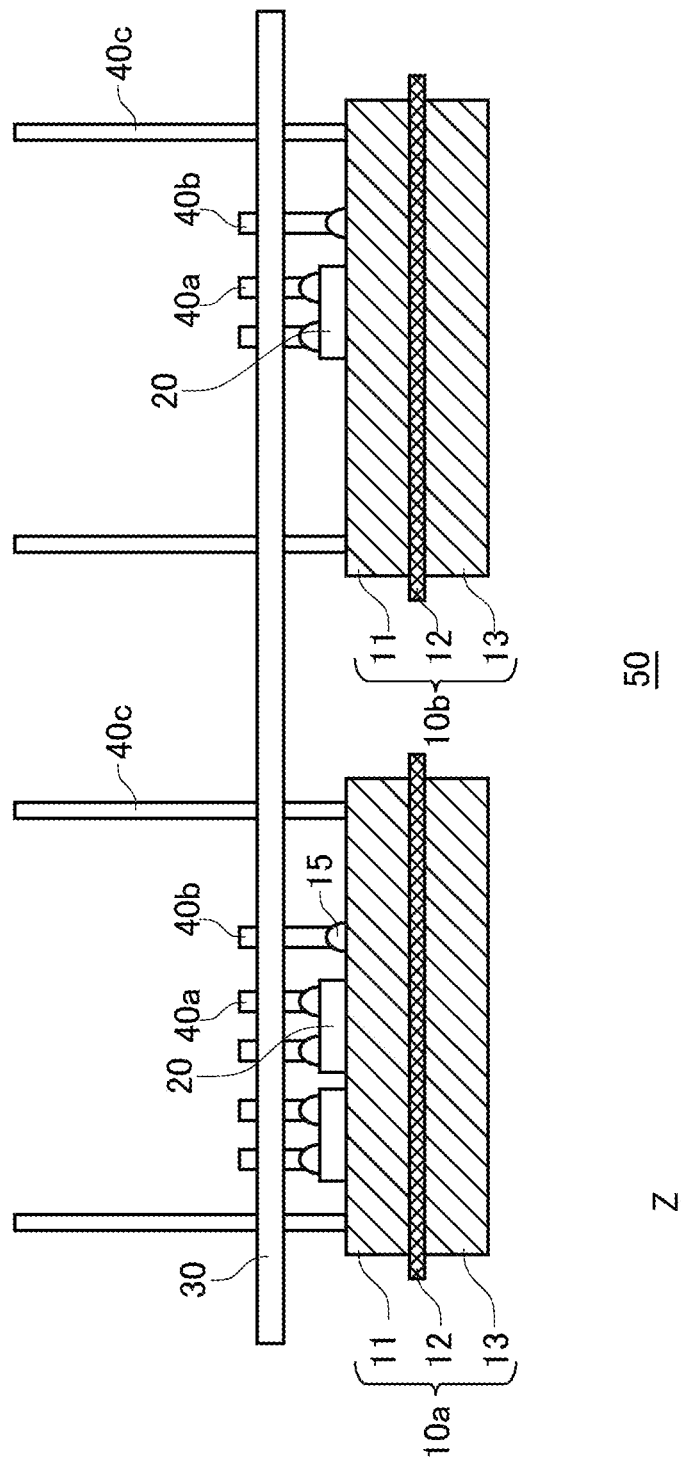
FIG. 1C shows one example of a cross-sectional view of a semiconductor assembly 50.

FIG. 1C shows one example of a cross-sectional view of a semiconductor assembly 50. The semiconductor assembly 50 includes the insulating substrate 10, the semiconductor chip 20, a printed circuit board 30, and a conductive member 40. The semiconductor assembly 50 of the present example includes the plurality of insulating substrates 10. The semiconductor assembly 50 is mounted inside the housing 110 of the semiconductor device 100.

The insulating substrate 10 is mounted with the semiconductor chip 20. The insulating substrate 10 may be a DCB (Direct Copper Bonding) substrate or an AMB (Active Metal Brazing) substrate. The semiconductor assembly 50 of the present example includes two insulating substrates being an insulating substrate 10a and an insulating substrate 10b aligned along the X-axis direction. The insulating substrate 10a and the insulating substrate 10b are disposed not closer than a predetermined insulation distance. The insulating substrate 10 has a circuit pattern layer 11, an insulating layer 12, and a conductive layer 13.

The circuit pattern layer 11 is on an upper surface of the insulating layer 12. The conductive layer 13 is on a lower surface of the insulating layer 12. The circuit pattern layer 11 and the conductive layer 13 may be formed of a plate containing a metal material such as copper or copper alloy. The circuit pattern layer 11 and the conductive layer 13 may be fixed to a surface of the insulating layer 12 with a bonding material such as a brazing material.

The insulating layer 12 is a plate member formed of an insulating material such as ceramics, which includes alumina ($Al_2O_3$), aluminum nitride (AlN), silicon nitride ($Si_3N_4$), or the like. A thickness of the insulating layer 12 is 0.2 mm or more, and 1 mm or less, for example.

The semiconductor chip 20 is disposed on a semiconductor substrate such as a silicon substrate. The semiconductor chip 20 may be formed on a compound semiconductor substrate including SiC, GaN, or the like. In one example, the semiconductor chip 20 includes a switching device such as an insulated gate bipolar transistor (IGBT) or a power MOSFET. The semiconductor chip 20 may include a RC-IGBT (Reverse-Conducting IGBT) with a freewheel diode (FWD).

The semiconductor chip 20 may be formed with an upper surface electrode and a lower surface electrode. The upper surface electrode and the lower surface electrode may be electrically connected to a negative potential and a positive potential of a power source, respectively. The insulating substrate 10 may be mounted with a plurality of semiconductor chips 20.

The printed circuit board 30 faces the plurality of insulating substrates 10. The printed circuit board 30 of the present example covers the insulating substrate 10a and the insulating substrate 10b. The printed circuit board 30 has an insulating plate and a circuit pattern layer on the insulating plate.

For example, the insulating plate of the printed circuit board 30 is a rigid circuit board of epoxy glass material or a flexible circuit board of polyimide material. Material of the printed circuit board 30 is not limited to the material described above.

The circuit pattern layer of the printed circuit board 30 connects an electrode of the semiconductor chip 20 to an external terminal. The circuit pattern layer of the printed circuit board 30 is formed on a surface of the insulating plate with a conductive metal such as copper, copper alloy, or aluminum. The printed circuit board 30 is arranged above the insulating substrate 10 with a space in between. The insulating substrate 10a and the insulating substrate 10b may be electrically connected via the printed circuit board 30.

The conductive member 40 electrically connects the plurality of insulating substrates 10 and the printed circuit board 30. The conductive member 40 is formed of a conductive metal including copper, aluminum, or the like into a columnar shape such as a cylindrical shape. A lower end of the conductive member 40 is fixed to the insulating substrate 10 or the semiconductor chip 20 by means of a bonding material such as a soldered part 15. An upper end of the conductive member 40 may be fixed to the printed circuit board 30 by soldering, brazing, caulking, or the like.

The conductive member 40 of the present example has a conductive member 40a, a conductive member 40b, and a conductive member 40c. The conductive member 40a electrically connects the semiconductor chip 20 and the circuit pattern layer of the printed circuit board 30. The conductive member 40b electrically connects the circuit pattern layer 11 and the circuit pattern layer of the printed circuit board 30. One end of the conductive member 40c is electrically connected to the circuit pattern layer 11, and the other end of the conductive member 40c protrudes out of the housing 110.

Figure 2A:
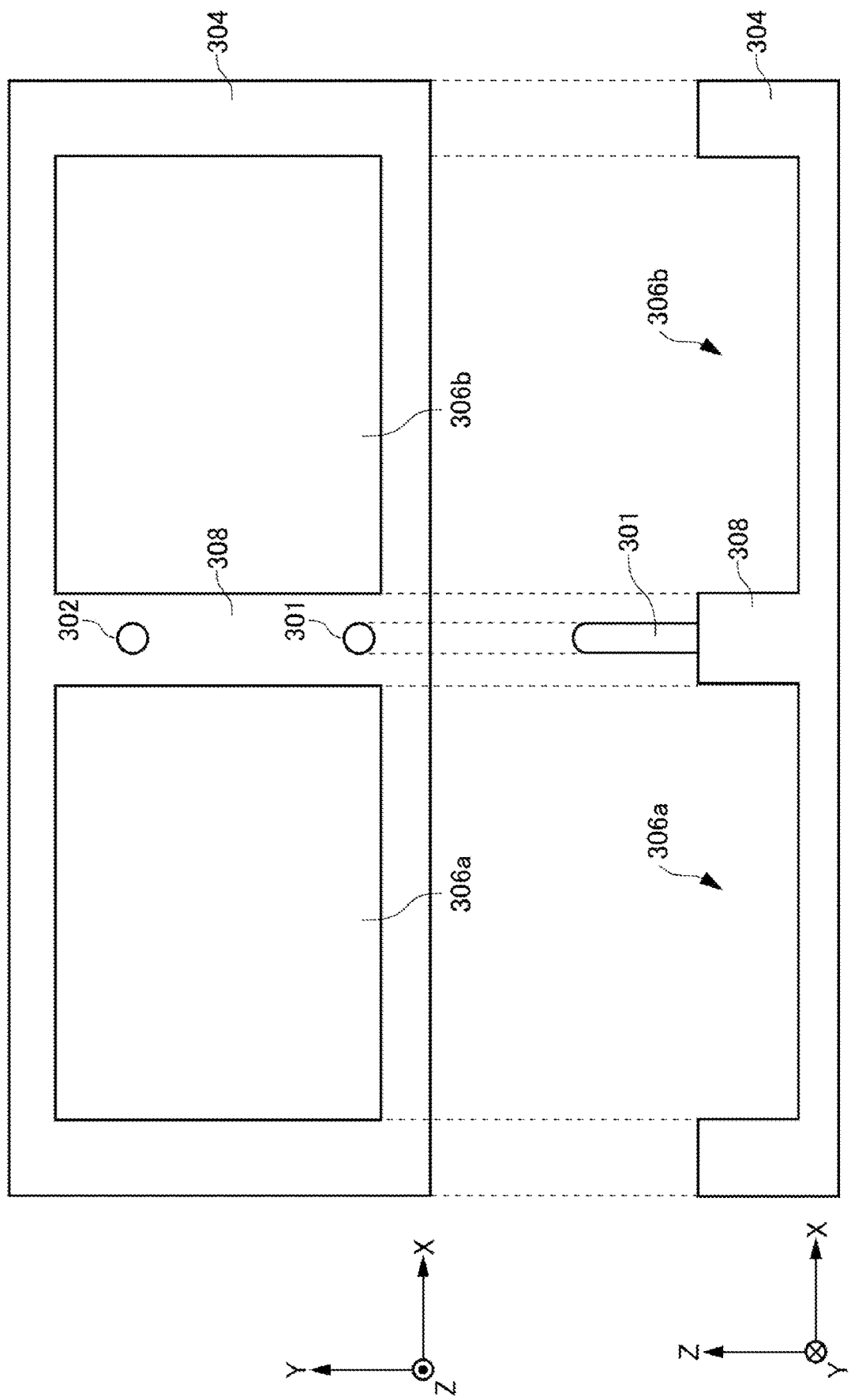
FIG. 2A shows a top view and a cross-sectional view of a lower jig 300.

FIG. 2A shows a top view and a cross-sectional view of a lower jig 300. The lower jig 300 is used for mounting with the semiconductor assembly 50, and thereby positioning the insulating substrate 10 and the printed circuit board 30. The lower jig 300 includes a plurality of columnar members, a frame 304, a recess 306, and a projection 308.

The lower jig 300 includes a first columnar member 301 and a second columnar member 302 as the plurality of columnar members. The plurality of columnar members of the lower jig 300 may have the same cross-sectional shapes or different cross-sectional shapes from each other.

The first columnar member 301 and the second columnar member 302 are for positioning the printed circuit board 30. The first columnar member 301 and the second columnar member 302 are arranged at positions corresponding to a through part 31 and a through part 32 of the printed circuit board 30, respectively. The through part 31 and the through part 32 will be described later.

The first columnar member 301 has a cross-sectional shape corresponding to a cross-sectional shape of the through part 31. The second columnar member 302 has a cross-sectional shape corresponding to a cross-sectional shape of the through part 32. The first columnar member 301 and the second columnar member 302 of the present example have a circular cross-sectional shape. Circular may mean a perfect circle having a predetermined radius. The first columnar member 301 and the second columnar member 302 may have different cross-sectional shapes from each other.

The frame 304 has a size and a shape corresponding to the semiconductor assembly 50. The frame 304 may be formed of material having excellent thermal conductivity in a furnace. For example, the material of the frame 304 is carbon.

The recess 306 is provided on the frame 304 in order to position the insulating substrate 10. The lower jig 300 has a plurality of recesses 306 inside the frame 304, and each of the plurality of insulating substrates 10 is arranged at a position corresponding to each of the plurality of recesses 306. The lower jig 300 has a recess 306a and a recess 306b aligned along the X-axis direction. Although the recess 306 of the present example is rectangular in a top view, a shape of the recess 306 is not limited to a rectangle. Note that, the top view means a view along the Z-axis.

The projection 308 is provided between the recess 306a and the recess 306b. That is, when the plurality of insulating substrates 10 is arranged on the lower jig 300, the projection 308 is between the plurality of insulating substrates 10. The first columnar member 301 and the second columnar member 302 are on an upper surface of the projection 308.

Figure 2B:
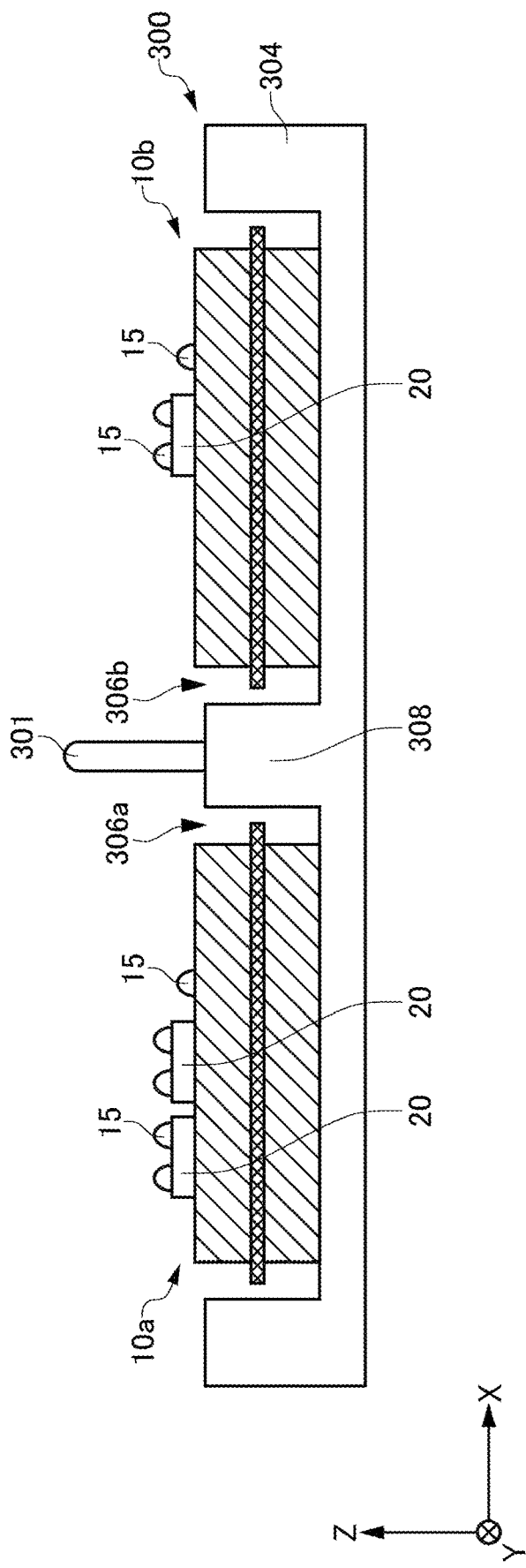
FIG. 2B shows one example of a process of arranging a plurality of insulating substrates 10 on the lower jig 300.

FIG. 2B shows one example of a process of arranging the plurality of insulating substrates 10 on the lower jig 300. The semiconductor chip 20 is arranged on each upper surface of the plurality of insulating substrates 10. The soldered part 15 is provided on an upper surface of the insulating substrate 10 and an upper surface of the semiconductor chip 20 in order to electrically connect with the conductive member 40. The first columnar member 301 is arranged between the plurality of insulating substrates 10.

The insulating substrate 10a is arranged inside the recess 306a, thereby having a limited position in the X-Y plane. The insulating substrate 10b is arranged inside the recess 306b, thereby having a limited position in the X-Y plane. In this manner, the insulating substrate 10a and the insulating substrate 10b are arranged at positions not closer than the predetermined insulation distance.

Figure 2C:
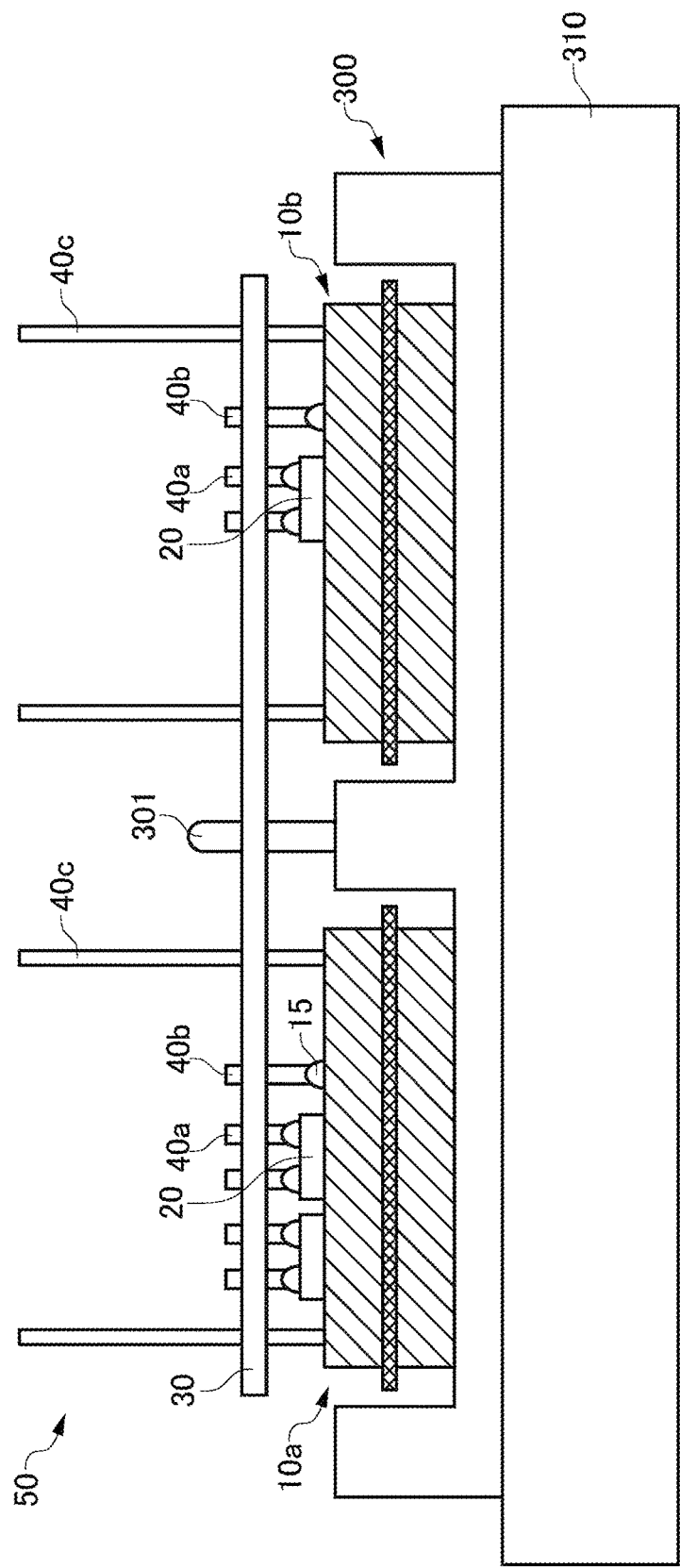
FIG. 2C shows one example of a process of arranging a printed circuit board 30 and a conductive member 40 on an insulating substrate 10.

FIG. 2C shows one example of a process of arranging the printed circuit board 30 and the conductive member 40 on the insulating substrate 10. The printed circuit board 30 is positioned by the plurality of columnar members so as to face the insulating substrate 10. The printed circuit board 30 may be positioned while being attached to the conductive member 40. For soldering, the printed circuit board 30 and the conductive member 40 are carried into a furnace while having a position limited by the lower jig 300. A hot plate 310 is disposed below the lower jig 300.

Figure 2D:
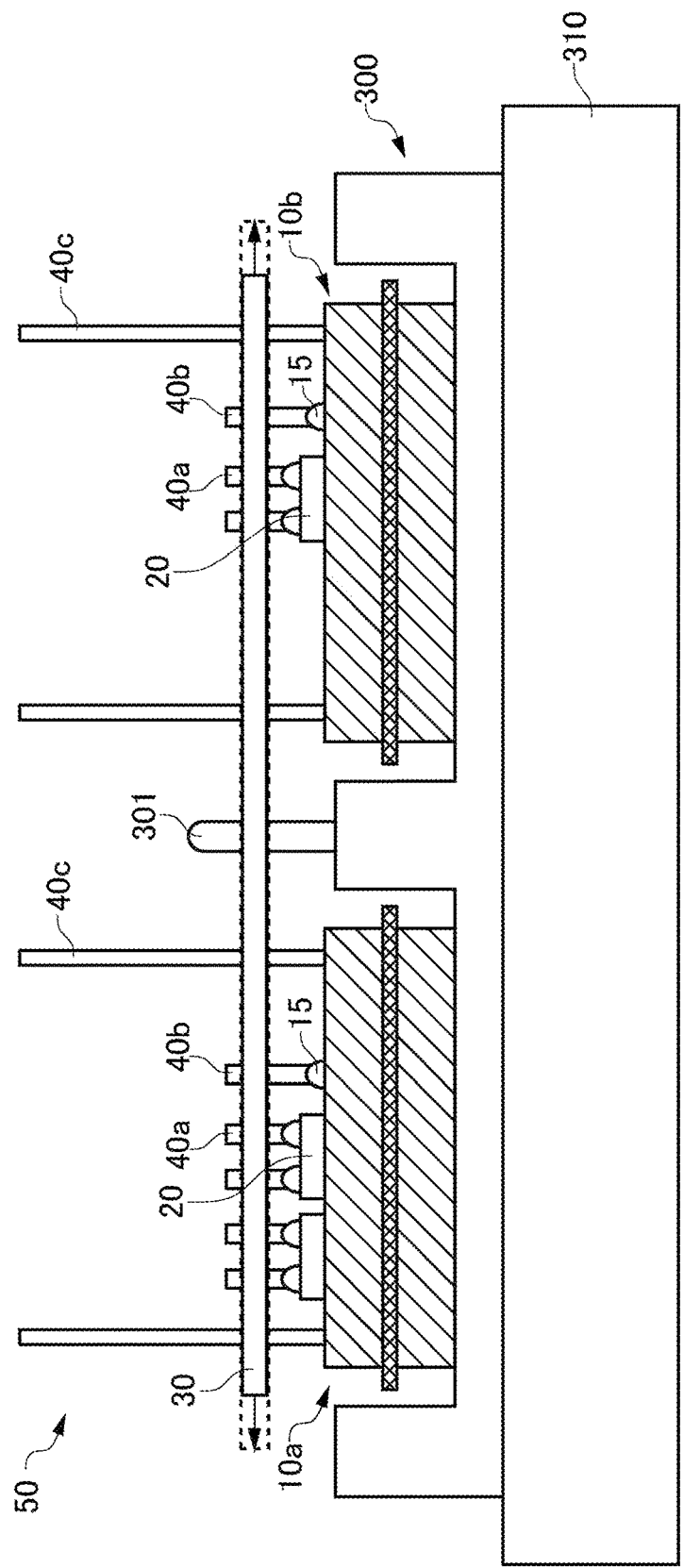
FIG. 2D shows one example of a process of heat-treating the semiconductor assembly 50.

FIG. 2D shows one example of a process of heat-treating the semiconductor assembly 50. The semiconductor assembly 50 is heat-treated while being positioned by the lower jig 300. The semiconductor assembly 50 expands in the heat-treatment. The printed circuit board 30 of the present example expands while having a position fixed by the first columnar member 301 in the X-Y plane.

Figure 2E:
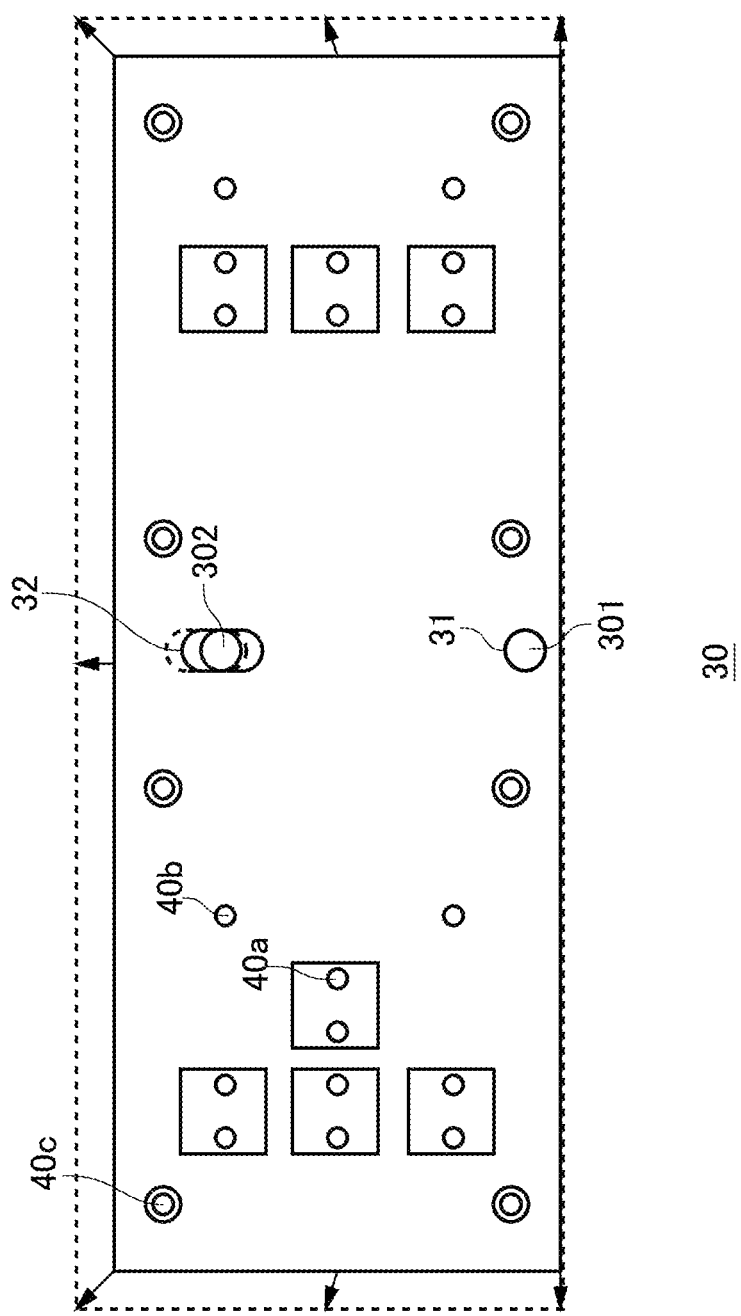
FIG. 2E shows a top view of the semiconductor assembly 50 in the heat-treating process.

FIG. 2E shows a top view of the semiconductor assembly 50 in the heat-treating process. Dashed lines on a periphery of the printed circuit board 30 illustrate the printed circuit board 30 being expanded in the heat-treatment.

The first columnar member 301 passes through the through part 31 from a lower surface to an upper surface. The through part 31 is fixed by the first columnar member 301 at a position relative to the first columnar member 301 in the X-Y plane. The through part 31 is one example of a first through part. The through part 31 has a cross-sectional shape substantially the same as a cross-sectional shape of the first columnar member 301. The through part 31 of the present example is a circular through hole. The through hole refers to the through part 31 having a circumference covered by the printed circuit board 30. Note that, the through part 31 may be polygonal such as rectangle in shape.

The second columnar member 302 passes through the through part 32 from a lower surface to an upper surface. The through part 32 has a cross-sectional shape different from the cross-sectional shape of the through part 31 in the top view. A cross-section of the through part 32 is wider than a cross-section of the through part 31.

The cross-sectional shape of the through part 32 has a major axis and a minor axis. The major axis may be a maximum width of the cross-sectional shape of the through part 32 in the top view. The minor axis may be a shorter width than the major axis of the cross-sectional shape of the through part 32 in the top view. The cross-sectional shape of the through part 32 may have line symmetry with respect to the major axis, or may not have line symmetry with respect to the major axis. Although the through part 32 of the present example is an oval through hole, the through part 32 may also be in another shape such as ellipse. The maximum width of the through part 32 is larger than a maximum width of the through part 31. The major axis of the through part 32 may be larger than the maximum width of the through part 31. The through part 32 is one example of a second through part. Note that, in the present example, the major axis of the through part 32 is in the Y-axis direction, and the minor axis of the through part 32 is in the X-axis direction.

The through part 32 has a fixed position relative to the second columnar member 302 in the X-axis direction. The second columnar member 302 of the present example prevents the printed circuit board 30 from rotating around the first columnar member 301 in the X-Y plane. The through part 32 has no fixed position relative to the second columnar member 302 in the Y-axis direction. This allows the printed circuit board 30 to extend and contract in the Y-axis direction. In this manner, expansion and contraction of the printed circuit board 30 are unobstructed. The through part 32 may be in another shape without being limited to the shape in the present example, provided that the expansion and contraction of the printed circuit board 30 are unobstructed.

The through part 31 and the through part 32 are aligned in a predetermined alignment direction. In the present example, the Y-axis direction is the alignment direction. That is, a lateral direction of the printed circuit board 30 is the alignment direction in the present example. The through part 32 has a wider width than a width of the through part 31 in the alignment direction. This allows the printed circuit board 30 to extend and contract from the through part 31 being a starting point to outside in the alignment direction, unless being obstructed by the second columnar member 302. A distance between the through part 31 and the through part 32 may be equal to or farther than half a width of the printed circuit board 30 in the lateral direction.

In the top view, the through part 31 is arranged between the plurality of insulating substrates 10 being adjacent to each other. Similarly, in the top view, the through part 32 may be arranged between the plurality of insulating substrates 10 being adjacent to each other. The through part 31 and the through part 32 may be between the plurality of insulating substrates 10 in the X-axis direction and be outer than the insulating substrate 10 in the Y-axis direction. The through part 31 and the through part 32 of the present example are provided close to the middle of the printed circuit board 30 in the X-axis direction. By aligning the through part 31 and the through part 32 in the lateral direction of the printed circuit board 30, the printed circuit board 30 can extend and contract from the through part 31 being a starting point to the outside in the longitudinal direction of the printed circuit board 30.

In the present example, the plurality of insulating substrates 10 and the printed circuit board 30 can maintain a positional relationship relative to each other without obstructing the expansion of the semiconductor assembly 50. In addition, in the present example, the first columnar member 301 and the second columnar member 302 have a simple configuration so that the number of parts of a jig can be reduced. Furthermore, since an upper jig is unnecessary for the lower jig 300, the semiconductor assembly 50 can be easily picked up and taken out after the heat-treatment.

Figure 2F:
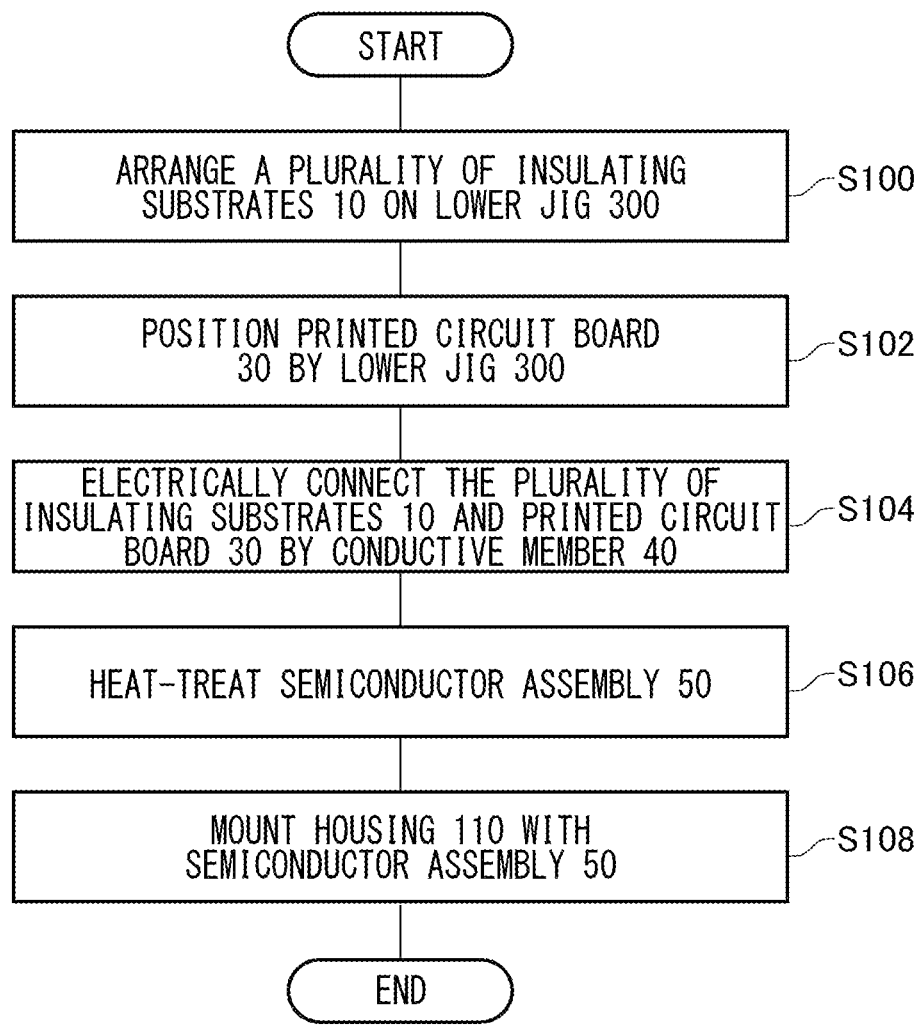
FIG. 2F shows one example of a flowchart for manufacturing the semiconductor device 100.

FIG. 2F shows one example of a flowchart for manufacturing the semiconductor device 100. In step S100, the plurality of insulating substrates 10 is arranged on the lower jig 300. The plurality of insulating substrates 10 is arranged in the plurality of recesses 306 of the lower jig 300. The plurality of insulating substrates 10 may be mounted with the semiconductor chip 20, and applied with the soldered part 15.

In step S102, the printed circuit board 30 is positioned by the lower jig 300. The printed circuit board 30 is positioned by the plurality of columnar members passing through the plurality of through parts. In step S104, the plurality of insulating substrates 10 is electrically connected to the printed circuit board 30 by the conductive member 40. The soldered part 15 is in an unsolidified state before heat-treating the semiconductor assembly 50, thus the conductive member 40 is temporarily fixed to the soldered part 15 by virtue of viscosity of the soldered part 15.

In step S106, the semiconductor assembly 50 is heat-treated. The heat-treating includes performing a temperature-rising process, a temperature-maintaining process, and a temperature-dropping process in a furnace. The semiconductor assembly 50 expands or contracts depending on a change in the temperature. The through part 31 and the through part 32 included in the semiconductor assembly 50 of the present example can relax influence caused by the expansion of the printed circuit board 30. In soldering of the semiconductor assembly 50, a self-alignment effect of the soldered part 15 facilitates fixing at a balanced position.

In step S108, the housing 110 is mounted with the semiconductor assembly 50. Since no upper jig is used in the manufacturing method of the present example, the semiconductor assembly 50 is easily taken out after the heat-treatment, thereby making automatic production more effective.

Figure 3A:
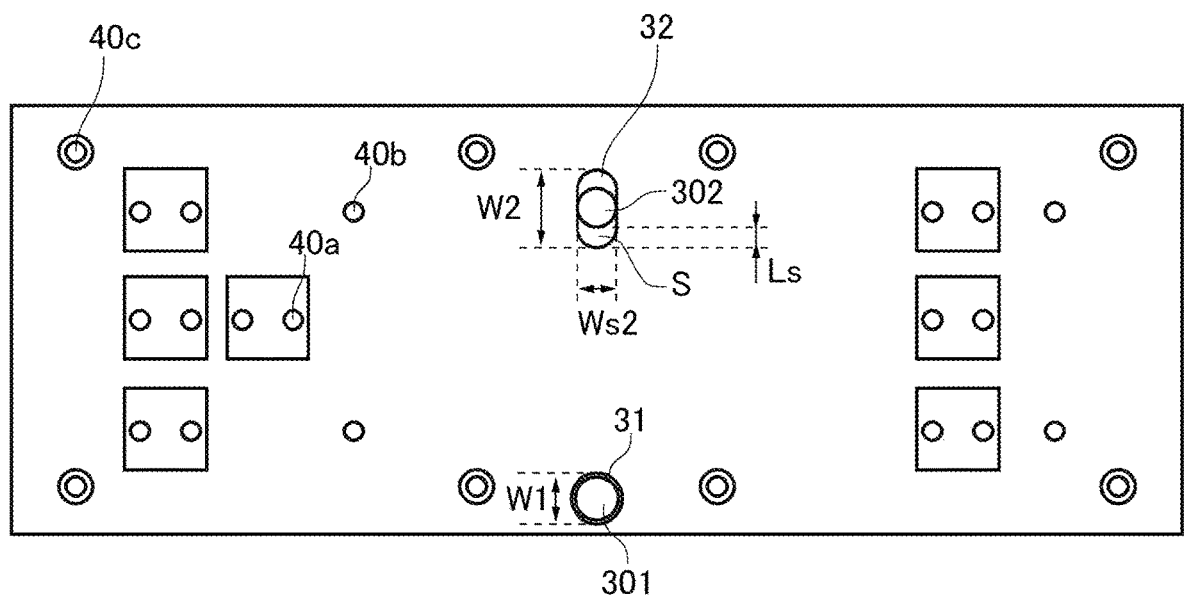
FIG. 3A shows one example of a configuration of a printed circuit board 30 and a lower jig 300.
Figure 3A:
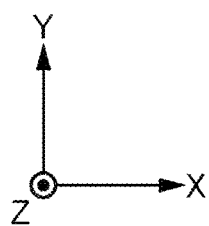

FIG. 3A shows one example of a configuration of a printed circuit board 30 and a lower jig 300. The printed circuit board 30 of the present example has the same structure as a structure of the printed circuit board 30 shown in FIG. 2E. In the present example, the printed circuit board 30 is yet to be heat-treated.

A width W1 is a width of a through part 31 in a predetermined direction in an X-Y plane. If the through part 31 is a circle, the width of the through part 31 corresponds to a diameter of the circle. In the present example, the width W1 is the width of the through part 31 in a Y-axis direction. The width W1 may be 0.5 mm or more, and 1.5 mm or less. In one example, the width W1 is 1 mm.

A width W2 is a width of a through part 32 in a predetermined direction in the X-Y plane. In the present example, the width W2 is a length of a major axis of the through part 32. In the present example, the width W2 is the width of the through part 32 in the Y-axis direction. The width W2 may be a maximum width of the through part 32. The width W2 may be larger than the width W1 of the through part 31, and larger than a diameter of a second columnar member 302. The width W2 may be 1.5 mm or more, and 2.5 mm or less. In one example, the width W2 is 2 mm.

A width Ws2 is a length of a minor axis of the through part 32. The width Ws2 may be equal to the width W1. The width Ws2 may be substantially equal to the diameter of the second columnar member 302. The width Ws2 may be 0.5 mm or more, and 1.5 mm or less. The width W2 may be 1.5 times the width Ws2 or more, and 2.5 times the width Ws2 or less.

A space S is a region between the second columnar member 302 and the printed circuit board 30. The space S is positioned between the through part 31 and the through part 32 in a top view.

A width Ls of the space S is a distance between the printed circuit board 30 and the through part 32 in an alignment direction before heat-treatment. This allows the printed circuit board 30 to be displaced into a position of the space S when the printed circuit board 30 expands. In one example, the width Ls of the space S is 0.5 mm or more, and 1.5 mm or less. The width Ls of the space S may be altered depending on a shape, material, or the like of the printed circuit board 30.

Figure 3B:
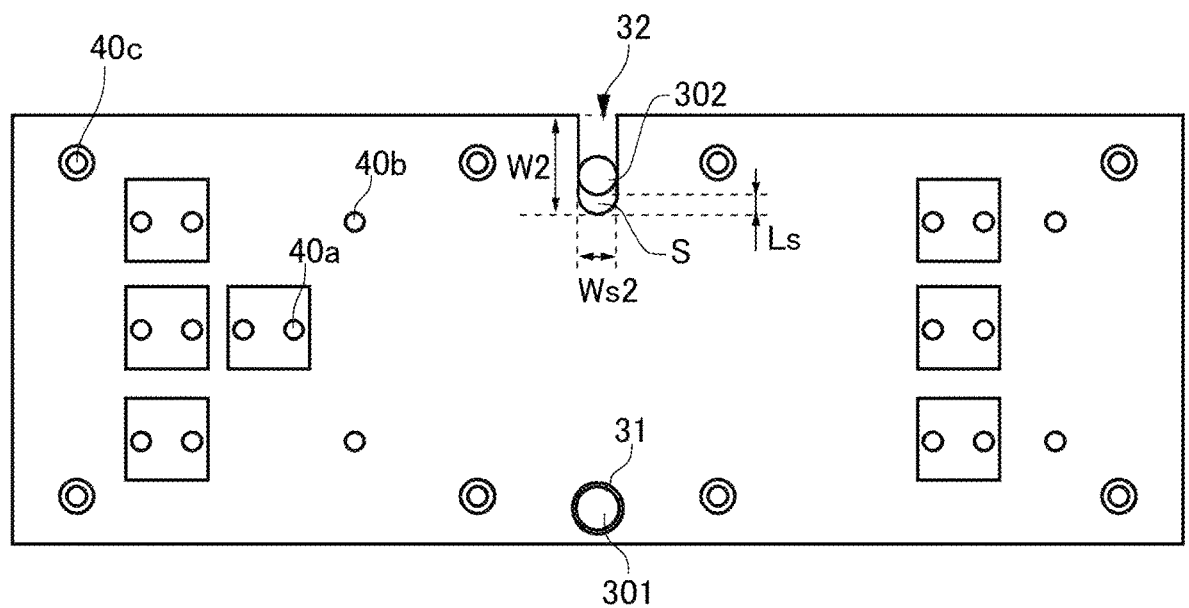
FIG. 3B shows a modification example of a printed circuit board 30 and a lower jig 300.
Figure 3B:
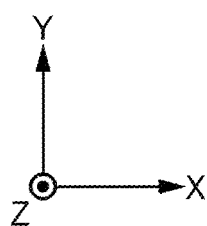

FIG. 3B shows a modification example of a printed circuit board 30 and a lower jig 300. The printed circuit board 30 of the present example has a notch as a through part 32. In the present example, the printed circuit board 30 is yet to be heat-treated. Difference between the present example and the embodiment shown in FIG. 3A will be particularly described.

Similar to the embodiment shown in FIG. 3A, a through part 31 has a position fixed by a first columnar member 301 in an X-Y plane. The through part 31 and the first columnar member 301 of the present example have a circular cross-section. The through part 31 and the first columnar member 301 may be in another shape without being limited to this shape, provided that positions can be fixed in the X-Y plane.

The through part 32 is the notch provided at an end of the printed circuit board 30. The notch is a region extending from a periphery of the printed circuit board 30 into the printed circuit board 30. The through part 32 forms a part of an oval or the like in shape. As above, the through part 32 may not completely cover a circumference of a second columnar member 302, and thus may have partly open structure.

The second columnar member 302 has a circular cross-section in the X-Y plane. The through part 32 is longitudinal in an alignment direction of the through part 31 and the through part 32 (a Y-axis direction in the present example). Therefore, expansion and contraction of the printed circuit board 30 are unobstructed. The through part 32 may be in another shape without being limited to the shape in the present example, provided that the expansion and contraction of the printed circuit board 30 are unobstructed. That is, the second columnar member 302 prevents the printed circuit board 30 from rotating around the first columnar member 301 in the X-Y plane without obstructing the printed circuit board 30 expanding or contracting in the Y-axis direction.

Figure 3C:
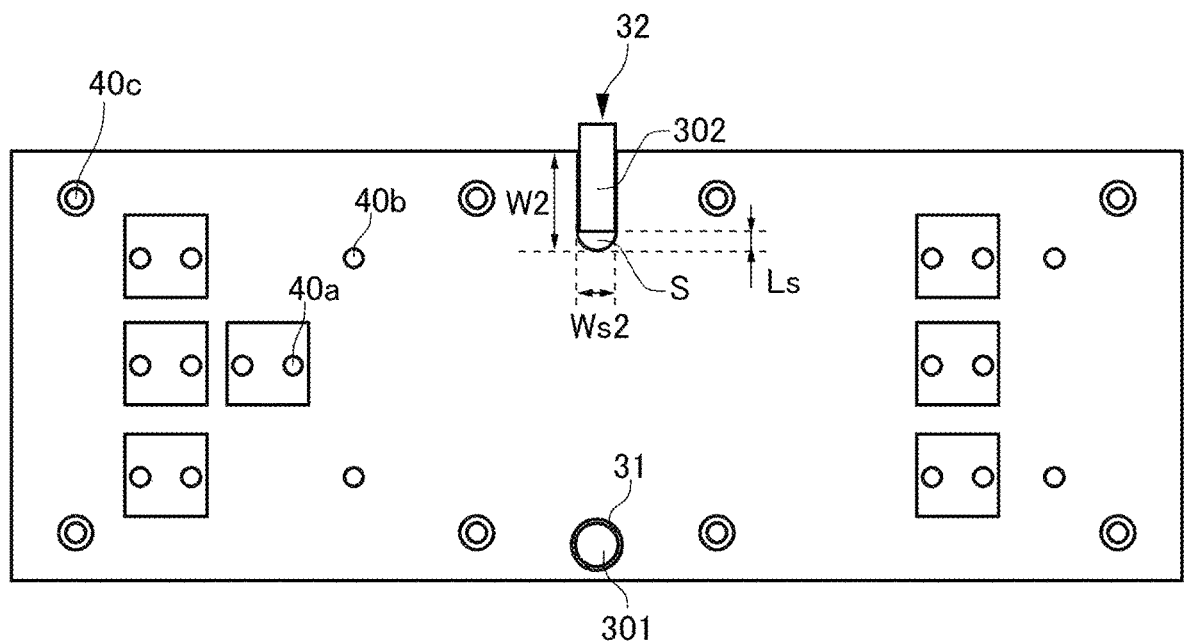
FIG. 3C shows a modification example of a printed circuit board 30 and a lower jig 300.
Figure 3C:
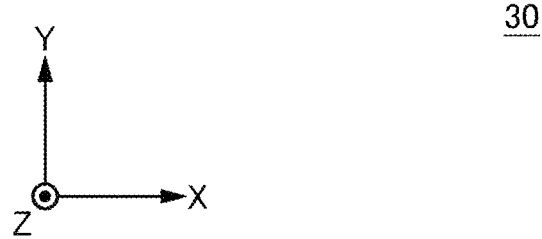

FIG. 3C shows a modification example of a printed circuit board 30 and a lower jig 300. A second columnar member 302 of the present example has a rectangular cross-section in an X-Y plane, which is different from the embodiment shown in FIG. 3B. In the present example, the printed circuit board 30 is yet to be heat-treated. Difference between the present example and the embodiment shown in FIG. 3B will be particularly described.

The second columnar member 302 is provided so as to pass through a through part 32. The second columnar member 302 may be provided so as to extend from the through part 32 to outside of the printed circuit board 30 in a top view. Alternatively, the second columnar member 302 may be within the through part 32 in the top view. Before heat-treating the printed circuit board 30, a space S is provided between the second columnar member 302 and the printed circuit board 30. The second columnar member 302 obstructs the through part 32 from shifting in an X-axis direction. In this manner, the second columnar member 302 prevents the printed circuit board 30 from rotating around a first columnar member 301 in the X-Y plane without obstructing the printed circuit board 30 expanding or contracting in a Y-axis direction.

Figure 3D:
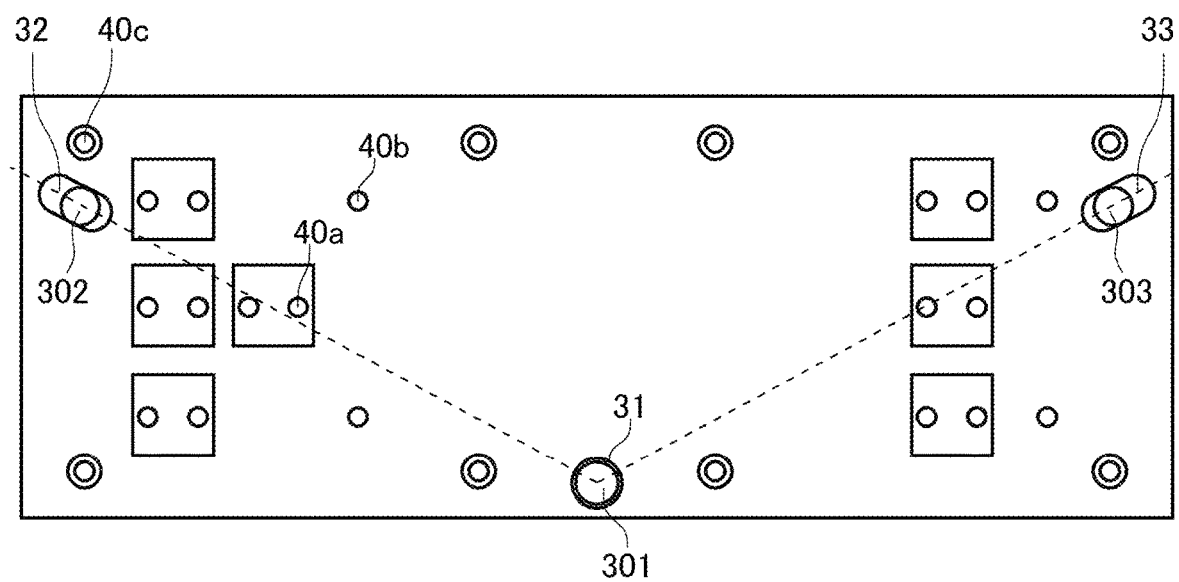
FIG. 3D shows a modification example of a printed circuit board 30 and a lower jig 300.
Figure 3D:
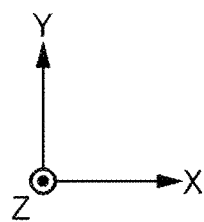

FIG. 3D shows a modification example of a printed circuit board 30 and a lower jig 300. The printed circuit board 30 of the present example includes a through part 31, a through part 32, and a through part 33. Similar to the embodiment shown in FIG. 3A, the through part 31 has a position fixed by a first columnar member 301 of the present example in an X-Y plane. The through part 31 is a circular through hole.

In a top view, the through part 32 and the through part 33 are provided closer to a periphery of the printed circuit board 30 than a plurality of insulating substrates 10. Distances between the through part 31 and the through part 32, and the through part 31 and the through part 33 are far enough to prevent the printed circuit board 30 from rotating around the through part 31 in the X-Y plane. The through part 32 and the through part 33 are oval through holes. The through part 33 is one example of a third through part.

The through part 32 is in a positive Y-axis direction and a negative X-axis direction with respect to the through part 31. The through part 32 has a major axis in an alignment direction of the through part 31 and the through part 32. The alignment direction of the through part 31 and the through part 32 is illustrated with a dashed line connecting the through part 31 and the through part 32. The through part 32 has a minor axis extending in a direction perpendicular to the major axis of the through part 32 in the X-Y plane.

The through part 33 is in the positive Y-axis direction and a positive X-axis direction with respect to the through part 31. The through part 33 has a major axis in an alignment direction of the through part 31 and the through part 33. The alignment direction of the through part 31 and the through part 33 is illustrated with a dashed line connecting the through part 31 and the through part 33. The through part 33 has a minor axis extending in a direction perpendicular to the major axis of the through part 33 in the X-Y plane. Alternatively, the printed circuit board 30 may have any one of the through part 32 and the through part 33.

Figure 4:
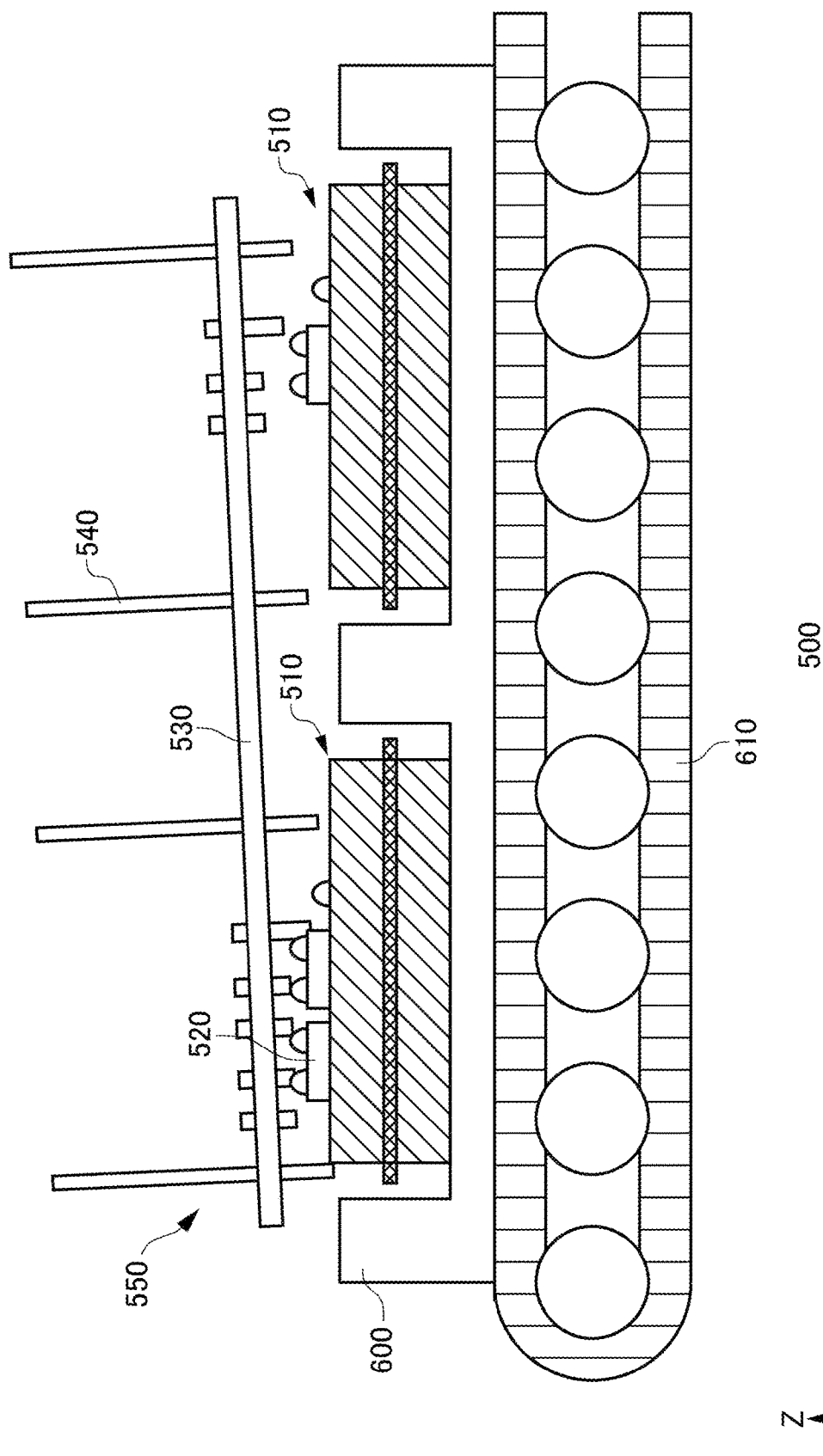
FIG. 4 shows one example of a manufacturing method of a semiconductor device 500 according to a comparative example.

FIG. 4 shows one example of a manufacturing method of a semiconductor device 500 according to a comparative example. The semiconductor device 500 includes an insulating substrate 510 mounted with a semiconductor chip 520. A semiconductor assembly 550 is being carried by a conveying unit 610 into a furnace for heat-treatment. The conveying unit 610 is a conveyer for automatically carrying the semiconductor assembly 550 mounted on a lower jig 600. In the present example, the insulating substrate 510 and a printed circuit board 530 have no fixed positional relationship relative to each other. Therefore, a conductive member 540 may come out of contact due to vibration, impact, or the like while being carried.

Figure 5:
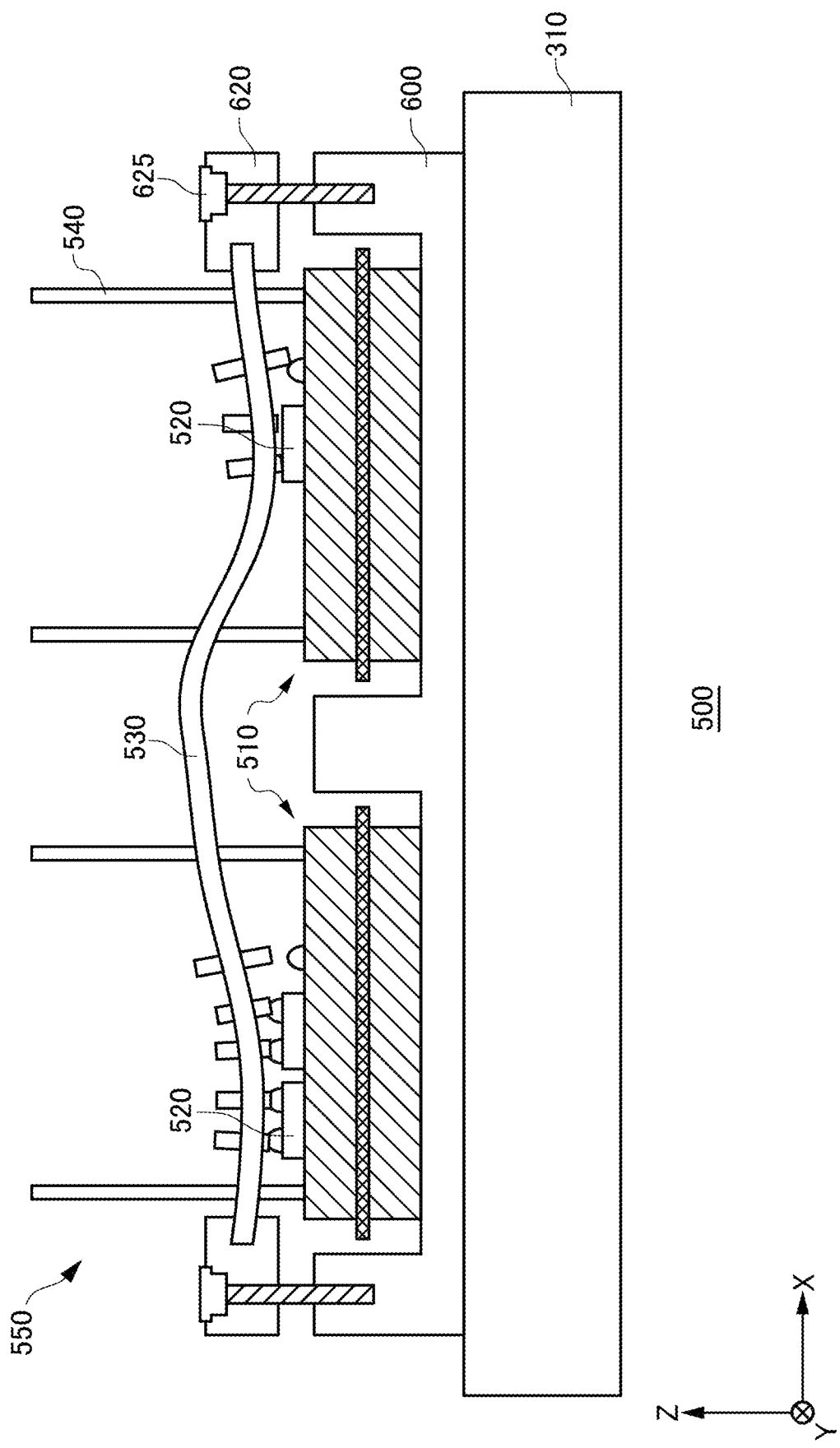
FIG. 5 shows one example of a manufacturing method of a semiconductor device 500 according to a comparative example.

FIG. 5 shows one example of a manufacturing method of a semiconductor device 500 according to a comparative example. A lower jig 600 and an upper jig 620 are screw-fixed by a fixing part 625. An insulating substrate 510 and a printed circuit board 530 have a fixed positional relationship relative to each other by virtue of the lower jig 600 and the upper jig 620. However, a warpage may be caused by a local stress concentration during heat-treatment, which may result in becoming a defective product.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, specification, or diagrams can be performed in any order as long as the order is not indicated by "prior to," "before," or the like and as long as an output from a previous process is not used in a later process. Even if a process flow is described using phrases such as "first" or "next" in the claims, specification, or diagrams, it does not necessarily mean that the process must be performed in this order.

What is claimed is:

1. A semiconductor device, comprising:
   a plurality of semiconductor chips;
   a plurality of insulating substrates each mounted with a corresponding one of the semiconductor chips;
   a printed circuit board facing the plurality of insulating substrates; and
   a conductive member for electrically connecting the plurality of insulating substrates and the printed circuit board, wherein
   the printed circuit board has:
      a first through part arranged between the plurality of insulating substrates being adjacent to each other in a top view; and
      a second through part different from the first through part in shape in a top view;
   wherein
   the second through part is arranged between the plurality of insulating substrates being adjacent to each other in a top view,
   the second through part has a cross-sectional shape having a major axis and a minor axis,
   the major axis is larger than a maximum width of a cross-sectional shape of the first through part,
   the first through part is arranged on a line extending from the major axis of the second through part, and
   the second through part includes a region having, along the major axis of the second through part, a constant width equal to that of the minor axis of the second through part.

2. The semiconductor device according to claim 1, wherein
   the first through part and the second through part are aligned in a predetermined alignment direction, and
   the second through part is wider than a width of the first through part in the alignment direction.

3. The semiconductor device according to claim 1, wherein
   the first through part and the second through part are aligned in a predetermined alignment direction, and
   the second through part is wider than a width of the first through part in the alignment direction.

4. The semiconductor device according to claim 1, wherein
   the first through part and the second through part are aligned in a predetermined alignment direction, and
   the second through part is wider than a width of the first through part in the alignment direction.

5. The semiconductor device according to claim 2, wherein the alignment direction is a lateral direction of the printed circuit board.

6. The semiconductor device according to claim 1, wherein
the first through part is a circular through hole, and
the second through part is a through hole having a major axis and a minor axis in a top view.

7. The semiconductor device according to claim 1, wherein
the first through part is a circular through hole, and
the second through part is a through hole having a major axis and a minor axis in a top view.

8. The semiconductor device according to claim 1, wherein
the first through part is a circular through hole, and
the second through part is a notch provided at an end of the printed circuit board.

9. The semiconductor device according to claim 1, wherein
the first through part is a circular through hole, and
the second through part is a notch provided at an end of the printed circuit board.

10. The semiconductor device according to claim 1, comprising:
the second through part and a third through part provided closer to a periphery of the printed circuit board than the plurality of insulating substrates, wherein
the first through part is a circular through hole, and
the second through part and the third through part are through holes having a
major axis and a minor axis in a top view.

* * * * *